United States Patent
Häberlen et al.

(10) Patent No.: US 9,443,941 B2
(45) Date of Patent: Sep. 13, 2016

(54) COMPOUND SEMICONDUCTOR TRANSISTOR WITH SELF ALIGNED GATE

(75) Inventors: Oliver Häberlen, Villach (AT); Gilberto Curatola, Villach (AT)

(73) Assignee: Infineon Technologies Austria AG, Villach (AT)

(*) Notice: Subject to any disclaimer, the term of this patent is extended or adjusted under 35 U.S.C. 154(b) by 36 days.

(21) Appl. No.: 13/487,698

(22) Filed: Jun. 4, 2012

(65) Prior Publication Data

US 2013/0320350 A1    Dec. 5, 2013

(51) Int. Cl.
| | |
|---|---|
| H01L 21/20 | (2006.01) |
| H01L 29/78 | (2006.01) |
| H01L 29/40 | (2006.01) |
| H01L 21/28 | (2006.01) |
| H01L 29/423 | (2006.01) |
| H01L 29/66 | (2006.01) |
| H01L 29/778 | (2006.01) |
| H01L 29/812 | (2006.01) |

(52) U.S. Cl.
CPC ............ *H01L 29/402* (2013.01); *H01L 21/28* (2013.01); *H01L 29/42316* (2013.01); *H01L 29/42364* (2013.01); *H01L 29/66462* (2013.01); *H01L 29/7787* (2013.01); *H01L 29/812* (2013.01); *H01L 29/8128* (2013.01)
USPC ............ 257/194; 438/172; 438/142; 438/671

(58) Field of Classification Search
CPC ............ H01L 29/66; H01L 29/66431; H01L 29/66522; H01L 29/201; H01L 29/2003; H01L 29/402; H01L 29/432; H01L 29/28; H01L 29/812; H01L 29/8128; H01L 29/7797; H01L 29/42316; H01L 29/42364; H01L 29/66462
USPC ............ 427/66; 438/142, 172, 257, 66, 671
See application file for complete search history.

(56) References Cited

U.S. PATENT DOCUMENTS

| | | | |
|---|---|---|---|
| 7,256,432 B2 * | 8/2007 | Okamoto | H01L 29/7787 257/192 |
| 7,279,194 B2 * | 10/2007 | Hiroki et al. | 427/66 |
| 7,550,783 B2 | 6/2009 | Wu et al. | |
| 7,573,078 B2 * | 8/2009 | Wu et al. | 257/194 |
| 7,692,263 B2 * | 4/2010 | Wu et al. | 257/488 |
| 7,855,401 B2 * | 12/2010 | Sheppard et al. | 257/194 |
| 7,893,500 B2 | 2/2011 | Wu et al. | |
| 7,915,644 B2 | 3/2011 | Wu et al. | |
| 8,035,128 B2 * | 10/2011 | Ikeda et al. | 257/192 |
| 8,053,345 B2 * | 11/2011 | Ahn et al. | 438/585 |
| 8,120,064 B2 | 2/2012 | Parikh et al. | |
| 8,304,332 B2 * | 11/2012 | Immorlica et al. | 438/582 |

(Continued)

*Primary Examiner* — Matthew W Such
*Assistant Examiner* — Stephen C Smith
(74) *Attorney, Agent, or Firm* — Murphy, Bilak & Homiller, PLLC

(57) ABSTRACT

A transistor device includes a compound semiconductor body having a first surface and a two-dimensional charge carrier gas disposed below the first surface in the compound semiconductor body. The transistor device further includes a source in contact with the two-dimensional charge carrier gas and a drain spaced apart from the source and in contact with the two-dimensional charge carrier gas. A first passivation layer is in contact with the first surface of the compound semiconductor body, and a second passivation layer is disposed on the first passivation layer. The second passivation layer has a different etch rate selectivity than the first passivation layer. A gate extends through the second passivation layer into the first passivation layer.

6 Claims, 17 Drawing Sheets

(56) References Cited

U.S. PATENT DOCUMENTS

| | | | |
|---|---|---|---|
| 8,309,987 B2* | 11/2012 | Derluyn et al. | 257/192 |
| 8,334,564 B2* | 12/2012 | Hirler et al. | 257/328 |
| 8,338,861 B2* | 12/2012 | Briere | H01L 21/28264 257/194 |
| 8,384,129 B2* | 2/2013 | Kub et al. | 257/194 |
| 8,390,000 B2* | 3/2013 | Chu et al. | 257/76 |
| 8,884,380 B2* | 11/2014 | Tanaka | H01L 29/404 257/409 |
| 2006/0202272 A1* | 9/2006 | Wu | H01L 29/7787 257/355 |
| 2007/0018199 A1* | 1/2007 | Sheppard et al. | 257/200 |
| 2008/0128752 A1* | 6/2008 | Wu | H01L 29/402 257/194 |
| 2009/0189187 A1* | 7/2009 | Briere | H01L 21/28264 257/192 |
| 2011/0221011 A1 | 9/2011 | Bahat-Treidel et al. | |
| 2012/0018735 A1* | 1/2012 | Ishii | H01L 29/404 257/76 |
| 2013/0140605 A1* | 6/2013 | Ramdani et al. | 257/192 |
| 2013/0153963 A1* | 6/2013 | Shealy | H01L 23/291 257/190 |
| 2013/0161692 A1* | 6/2013 | Koudymov | H01L 29/7787 257/192 |

* cited by examiner

COMPOUND SEMICONDUCTOR TRANSISTOR WITH SELF ALIGNED GATE

TECHNICAL FIELD

The instant application relates to compound semiconductor transistors, and more particularly to compound semiconductors with self-aligned gates.

BACKGROUND

Conventional HEMT (high electron mobility transistor) devices fabricated in GaN technology are based on etching a gate opening into the first level surface passivation eventually including a gate base recess into the barrier layer (e.g. AlGaN), followed by deposition of an optional gate dielectric and a gate electrode. The electrode is then patterned in a second step independently from the gate base opening. This leads to an overlap of the gate electrode beyond the gate base defined by the process and lithography overlay tolerances. That is, the conventional GaN HEMT gate has a T-shape. This overlap of the gate toward the drain direction leads to an unwanted large gate-to-drain capacitance Cgd.

The gate-to-drain capacitance Cgd problem can be circumvented by skipping the first level surface passivation and patterning the gate electrode directly on the barrier layer (e.g. AlGaN with GaN cap) of the GaN HEMT. However, this approach causes degradation of the barrier surface condition when the gate patterning is done by plasma etching which is needed to realize short gate lengths e.g. <1 μm. This approach also does not allow the usage of a so-called in-situ passivation scheme where the barrier layer is capped with a SiN layer already available in the epitaxy tool. Deposition of this passivation layer after the gate electrode is formed limits the available process options, as e.g. an LPCVD (low-pressure chemical vapor deposition) nitride is not possible after the gate metal electrode is formed.

SUMMARY

The embodiments described herein provide a compound semiconductor transistor device having a first level passivation scheme (or in-situ passivation) with a non T-shape gate. The gate structure has a significantly reduced gate-to-drain capacitance Cgd as compared to equivalent conventional devices.

According to an embodiment of a transistor device, the device comprises a compound semiconductor body having a first surface and a two-dimensional charge carrier gas disposed below the first surface in the compound semiconductor body. The transistor device further includes a source in contact with the two-dimensional charge carrier gas and a drain spaced apart from the source and in contact with the two-dimensional charge carrier gas. A first passivation layer is in contact with the first surface of the compound semiconductor body, and a second passivation layer is disposed on the first passivation layer. The second passivation layer has a different etch rate selectivity than the first passivation layer. A gate extends through the second passivation layer into the first passivation layer.

According to an embodiment of a method of manufacturing a transistor device, the method comprises: providing a compound semiconductor body having a first surface and a two-dimensional charge carrier gas disposed below the first surface in the compound semiconductor body; forming a source in contact with the two-dimensional charge carrier gas; forming a drain spaced apart from the source and in contact with the two-dimensional charge carrier gas; forming a first passivation layer in contact with the first surface of the compound semiconductor body; forming a second passivation layer on the first passivation layer, the second passivation layer having a different etch rate selectivity than the first passivation layer; and forming a gate extending through the second passivation layer into the first passivation layer.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Described next are embodiments of a heterostructure field effect transistor (HFET) having a first level passivation scheme (or in-situ passivation) with a non T-shape gate. The term HFET is also commonly referred to as HEMT (high electron mobility transistor), MODFET (modulation-doped FET) or MESFET (metal semiconductor field effect transistor). The terms compound semiconductor transistor, HFET, HEMT, MESFET and MODFET are used interchangeably herein to refer to a field effect transistor incorporating a junction between two materials with different band gaps (i.e. a heterojunction) as the channel. For example, GaAs may be combined with AlGaAs, GaN may be combined with AlGaN, InGaAs may be combined with InAlAs, GaN may be combined with InGaN, etc. Also, transistors may have AlInN/AlN/GaN barrier/spacer/buffer layer structures. The term compound semiconductor transistor as used herein may also refer to a transistor fabricated using a single epitaxial compound semiconductor epitaxial such as epitaxial SiC. In each case, the gate structure of the compound semiconductor transistor has a significantly reduced gate-to-drain capacitance Cgd as compared to equivalent conventional devices.

Figure 1:
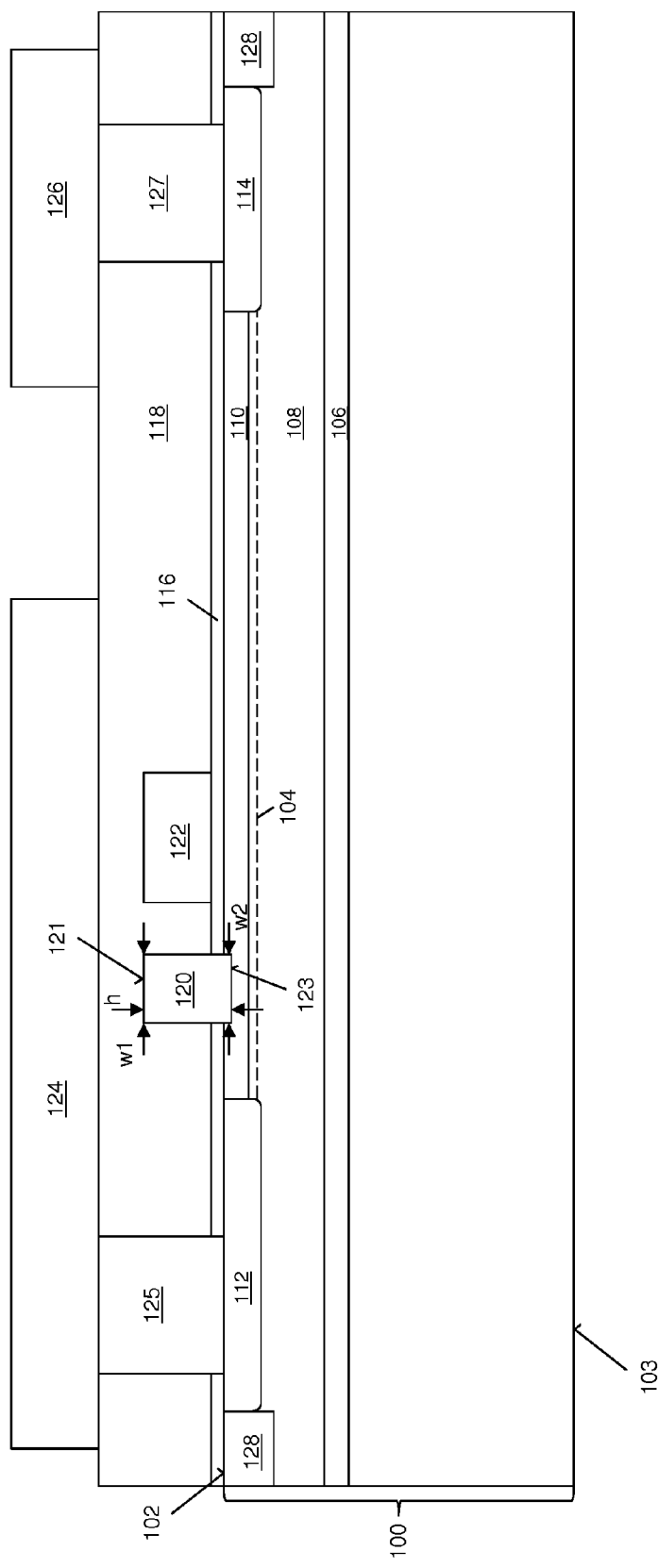
FIG. 1 illustrates a cross-sectional view of a compound semiconductor transistor.

FIG. 1 illustrates a cross-sectional view of an embodiment of an HFET which includes a compound semiconductor body 100 having a first surface 102 and a two-dimensional charge carrier gas 104 disposed below the first surface 102 in the compound semiconductor body 100. In one embodiment, the HFET is GaN-based and the compound semiconductor body 100 includes a nucleation layer 106, a GaN buffer layer 108 on the nucleation layer 106 and a GaN alloy barrier 110 layer on the GaN buffer layer 108. The barrier layer 110 may comprise any suitable GaN alloy such as AlGaN, InAlN, AlN, InAlGaN, etc. The source 112 of the HFET extends through the GaN alloy barrier layer 110 into the GaN buffer layer 108. The drain 114 of the HFET is spaced apart from the source 112 and also extends through the GaN alloy barrier layer 110 into the GaN buffer layer 108.

In general with GaN technology, GaN-based heterostructures can be grown along the c-direction (i.e., the Ga-face) or along the N-face e.g. for GaN/AlGaN heterostructures. Either growth orientation can be used in fabricating the GaN-based structures described herein. Also with GaN technology, the presence of polarization charges and strain effects result in the realization of a two-dimensional charge carrier gas which is a two-dimensional electron or hole inversion layer characterized by very high carrier density and carrier mobility. Such a two-dimensional charge carrier gas forms the conductive channel region 104 of the HFET. A thin e.g. 1-2 nm AlN layer can be provided between the GaN buffer layer 108 and the GaN alloy barrier layer 110 to minimize alloy scattering and enhance 2 DEG mobility. Other compound semiconductor technologies which have a two-dimensional electron or hole gas can also be used. In each case, polarization charges are used to form the two-dimensional charge carrier gas channel region 104 of the HFET. Other combinations of III-V semiconductor materials can be used in order to form a 2 DEG or 2 DHG (two-dimensional hole gas) channel region 104 in the buffer layer 108 as is well known in the art. In general, any heterostructure can be used where a band discontinuity is responsible for the device concept. Also, the source 112 and the drain 114 may be contacted at the same surface 102 of the compound semiconductor body 100 as shown in FIG. 1. Alternatively, the source 112 and/or the drain 114 can be electrically contacted at the backside 103 of the structure through a corresponding conductive via (not shown) extending from the source 112 and/or the drain 114 to the backside 103 e.g. which can be metallized and/or a highly doped substrate such as an n+ Si substrate.

The source 112 and the drain 114 both contact the two-dimensional charge carrier gas 104. The HFET can be normally-on meaning that the HFET operates in depletion mode, or normally-off meaning that the HFET operates in enhancement mode. In either case, a surface passivation layer 116 contacts the first (top) surface 102 of the compound semiconductor body 100. In one embodiment, the surface passivation layer 116 comprises $Si_3N_4$, $Al_2O_3$, $SiO_2$, $HfO_2$, or $ZrO_2$. A second passivation layer 118 is disposed on the surface passivation layer 116. The second passivation layer 118 has a different etch rate selectivity than the first passivation layer 116. For example, the second passivation layer 118 can be silicon dioxide ($SiO_2$) when the surface passivation layer 116 is silicon nitride. In general, the second passivation layer 118 has a different etch selectivity than the surface passivation layer 116 and can comprise e.g. $SiO_2$, $Si_3N_4$, silicate glasses such as PSG (phosphorus silicate glass) or BPSG (borophosphosilicate glass), etc.

The surface passivation layer 116 is not formed over the gate 120 of the HFET. That is, the surface passivation layer 116 is not formed after the gate 120. Instead, the surface passivation layer 116 is formed on the first (top) surface 102 of the compound semiconductor body 100 and the second passivation layer 118 is formed on the surface passivation layer 116 before the gate 120 is formed. Openings are then etched into the second passivation layer 118 to form the gate 120 and an optional field plate 122. The etching is carried out selectively with respect to the surface passivation layer 116. The etching of the surface passivation layer 116 is done with a block-out lithography step which masks the opening for the optional field plate 122 if provided. This is followed by an optional deposition of a gate dielectric and the deposition of an electrically conductive material such that the openings are at least partly filled with the conductive material. The excess portion of the conductive material is then removed from the second passivation layer 118 e.g. by any suitable planarization process such as etching-back or chemical-mechanical polishing so that the gate 120 does not have a T-shape and the surface passivation layer 116 does not cover the gate 120. In a case of the gate being recessed into the compound semiconductor body 100, the recess is self-aligned to the opening in the overlying passivation layers 116, 118.

The optional field plate 122 is spaced apart from the gate 120 in the second passivation layer 118 and disposed on the surface passivation layer 116. The optional field plate 122 can be electrically connected to the source 112 or the gate 120, or float. The optional field plate 122 depletes the channel region 104 formed in the compound semiconductor body 100 e.g. by about 30 to 40V when connected to the source potential. The optional field plate 122 also reduces the gate-to-drain capacitance Cgd of the transistor, improves $Q_{GD}/Q_{GS}$ (gate-to-drain and gate-to-source charges) ratio and allows for higher electric fields. Source, drain and gate electrodes 124, 126 and corresponding vias 125, 127 are then formed on the second passivation layer 118 to the respective nodes of the transistor as shown in FIG. 1 where the gate electrode is out of view.

The gate 120 of the HFET has a first side 121 facing away from the compound semiconductor body 100 and a second side 123 facing the compound semiconductor body 100. According to the embodiment shown in FIG. 1, the width (w1) of the gate 120 at the first side 121 is the same as the width (w2) of the gate 120 at the second side 123. That is, the gate 120 has a uniform width over the entire height (h) of the gate 120. Also according to the embodiment shown in FIG. 1, the gate 120 extends completely through the surface passivation layer 116 and into the compound semiconductor body 100. A device isolation region 128 such as a dielectric material or implanted region isolates the transistor from other devices formed on the same die.

Figure 2A:
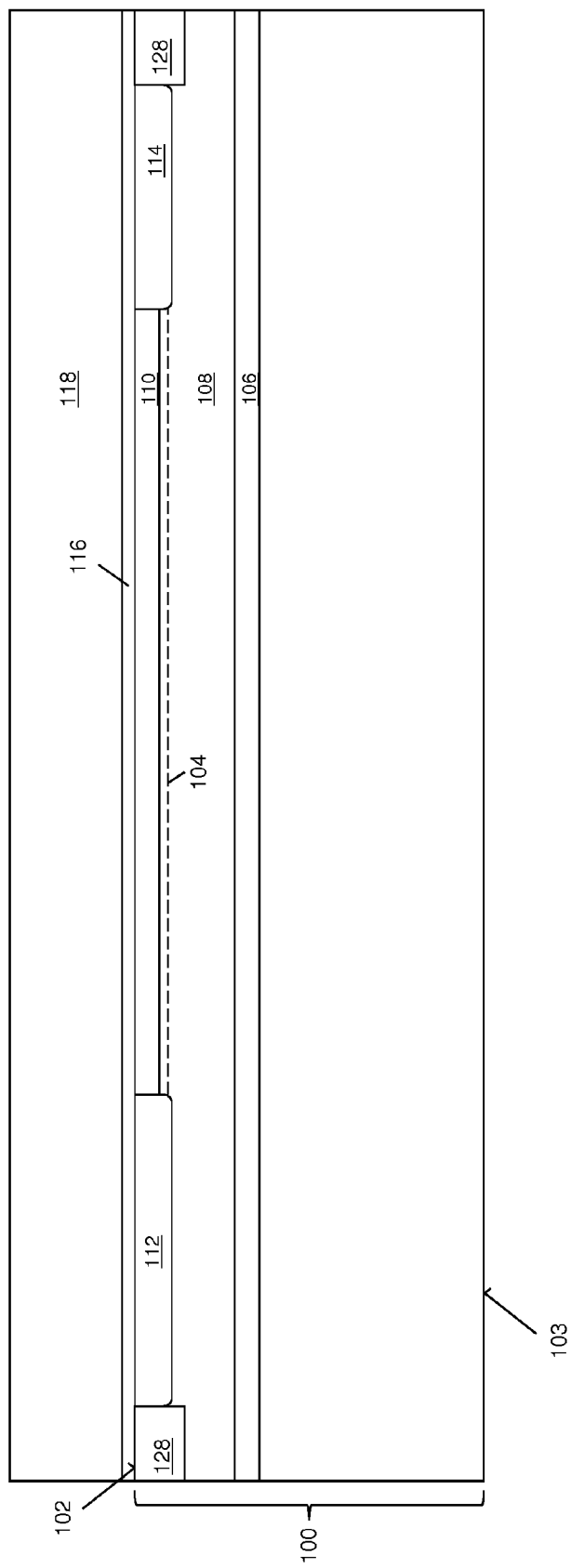
FIGS. 2A through 2E illustrate cross-sectional views of the compound semiconductor transistor of FIG. 1 during different stages of manufacturing.

FIGS. 2A to 2E illustrate cross-sectional views of the transistor device of FIG. 1 during different steps of the manufacturing process. FIG. 2A shows the compound semiconductor body 100 after the source 112 and the drain 114 are formed in contact with the two-dimensional charge carrier gas 104, the surface passivation layer 116 is formed in contact with the first (top) surface 102 of the compound semiconductor body 100 and the second passivation layer 118 is formed on the first passivation layer 116. The thickness of the surface passivation layer 116 controls the action of the optional field plate 122, if provided. The thickness of the second passivation layer 118 controls the height of the gate 120 and the optional field plate 122. In one embodiment, the surface passivation layer 116 comprises a layer of silicon nitride less than 100 nm thick and the second passivation layer 118 comprises a layer of silicon dioxide greater than 300 nm thick formed e.g. via a TEOS (Tetraethyl orthosilicate) process.

Figure 2B:
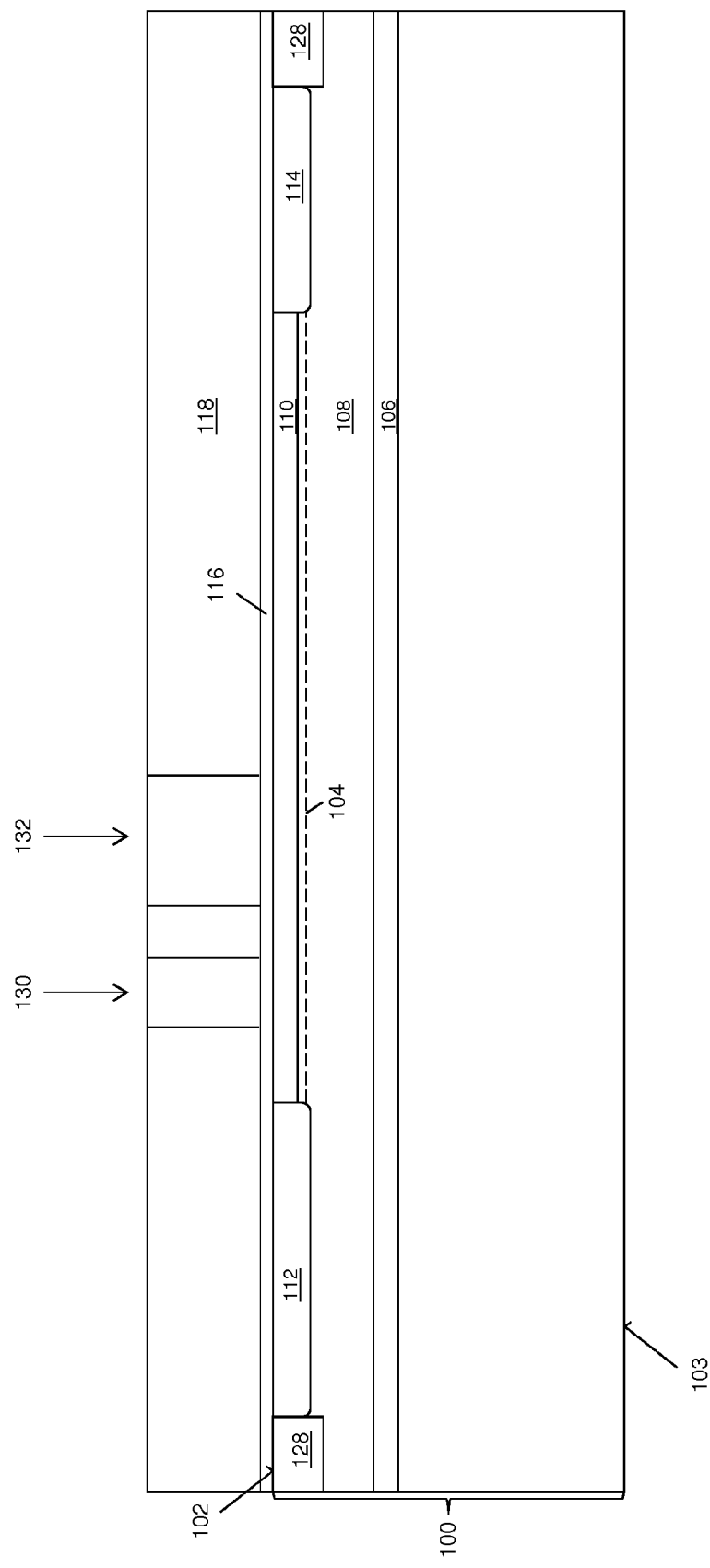

The gate 120 and optional field plate 122 are formed by the following process. Gate and field plate openings 130, 132 are formed so the openings 130, 132 extend through the second passivation layer 118 to the surface passivation layer 116 as shown in FIG. 2B. The gate and field plate openings 130, 132 are formed in a single lithography step according to this embodiment, preventing misalignment. Only the critical dimension of the lithography process governs the distance between the gate and field plate openings 130, 132. The gate and field plate openings 130, 132 are etched through the second passivation layer 118 selective to the underlying surface passivation layer 116. Hence the different etch rate selectivity for the passivation layers 116, 118.

Figure 2C:
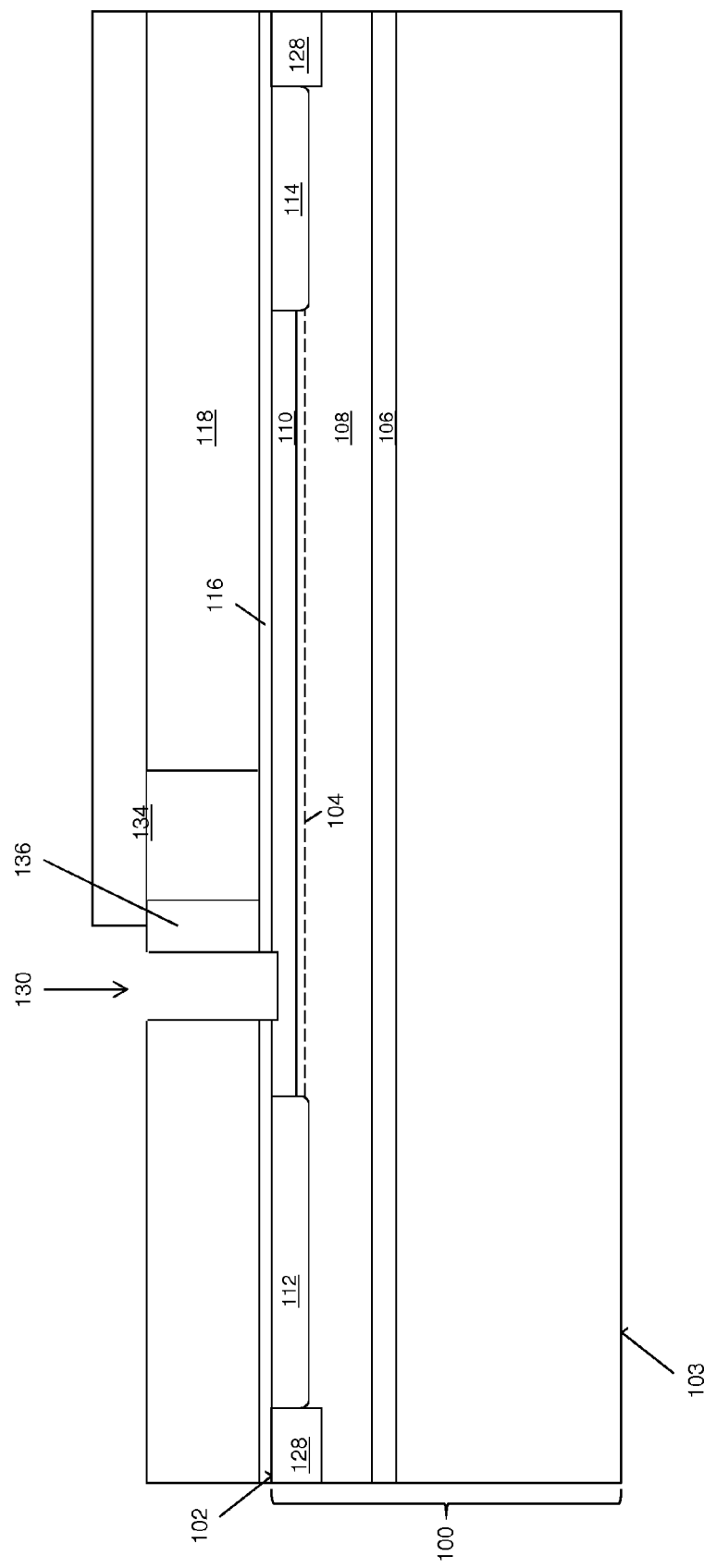

A mask layer 134 is then formed on a region of the second passivation layer 118 so that the field plate opening 132 is protected by the mask layer 134 and the gate opening 130 is unprotected as shown in FIG. 2C. The mask layer 134 need only cover part of the mesa 136 between the gate opening 130 and the field plate opening 132. The gate opening 130 is extended through the surface passivation layer 116 and into the compound semiconductor body 100 when the field plate opening 132 is protected as shown in FIG. 2C. In an alternative embodiment, etching of the surface passivation layer 116 stops before the first (top) surface 102 of the compound semiconductor body 100 is reached so that gate opening 130 terminates before reaching the compound semiconductor body 100 and part of the first passivation layer 116 remains under the gate opening 130. In either case, the base of the gate opening 130 is formed partly or completely through the surface passivation layer 116 while the field gate opening 132 is protected and therefore does not extend into the underlying surface passivation layer 116.

Figure 2D:
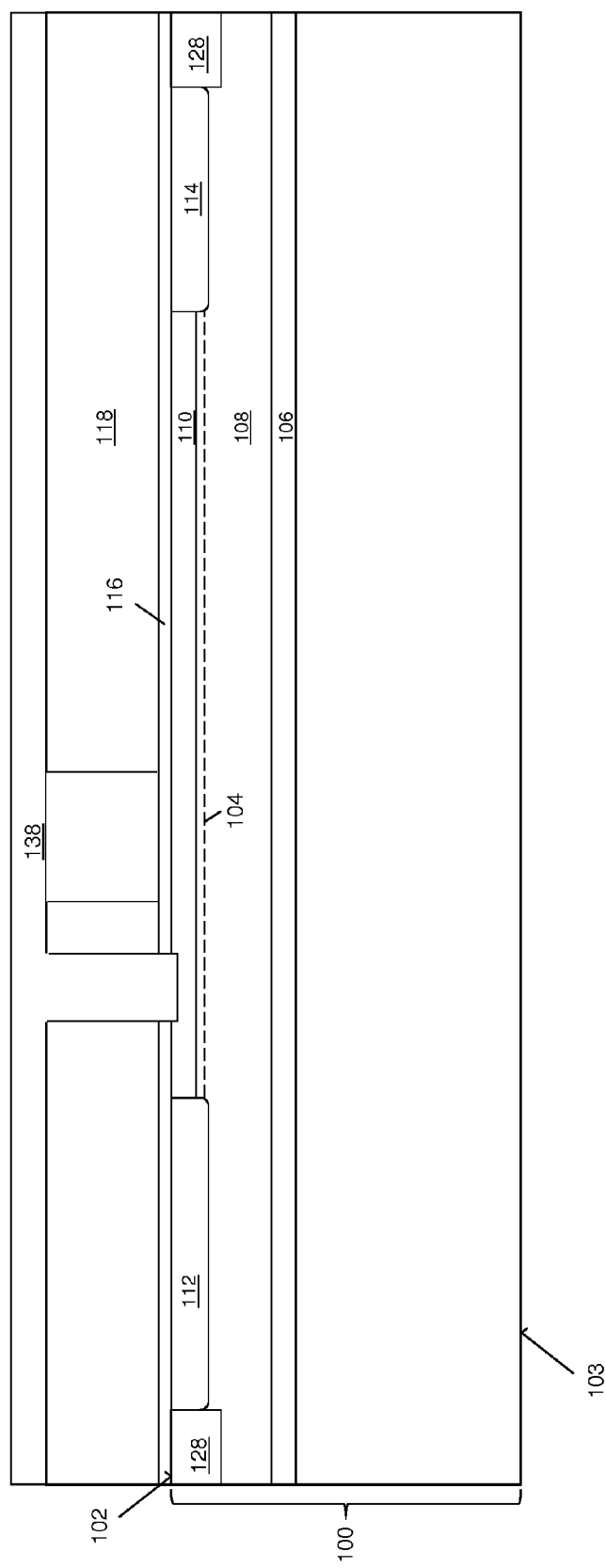
Figure 2E:
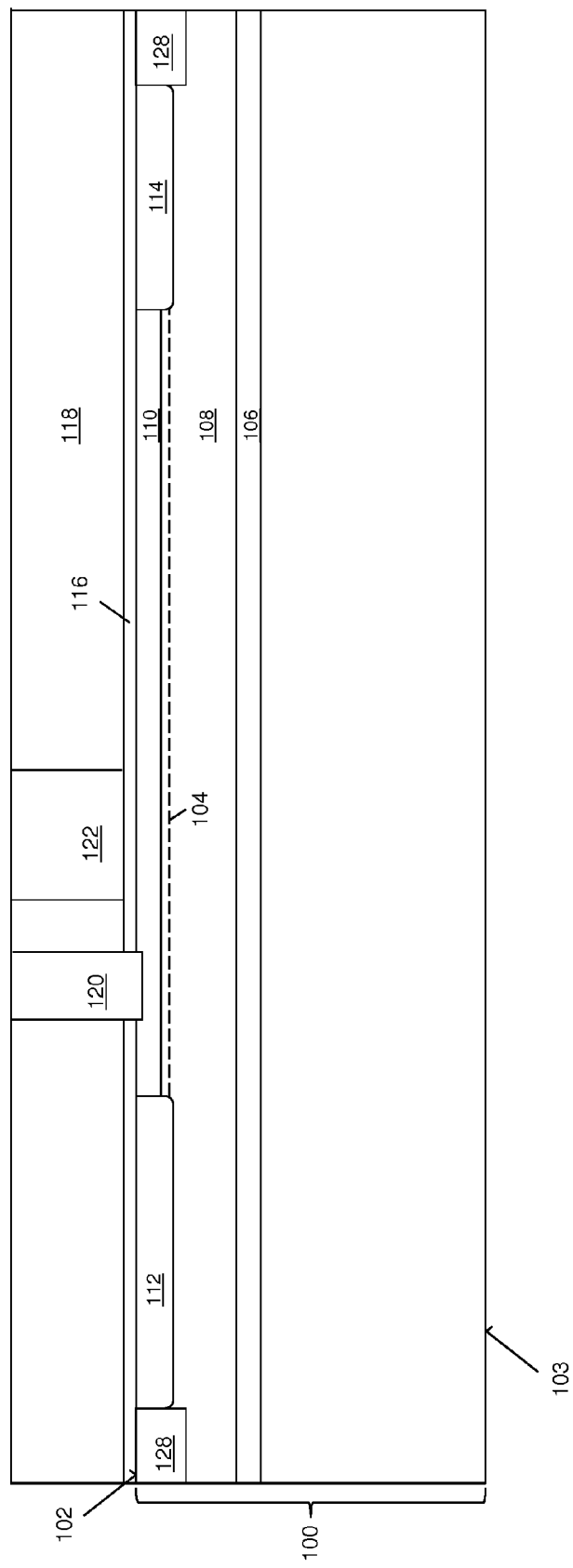

Next, an electrically conductive material 138 is deposited on the second passivation layer 118 after the gate and field plate openings 130, 132 are formed and the mask layer 134 is removed so that the gate and field plate openings 130, 132 are at least partly filled with the electrically conductive material 138 as shown in FIG. 2D. Any suitable electrically conductive material 138 may be used e.g. TaN/W via CVD (chemical vapor deposition) or n+ polysilicon. The excess electrically conductive material 138 is then removed from the side of the second passivation layer 118 facing away from the compound semiconductor body 100 as shown in FIG. 2E. Any suitable process can be used to planarize the second passivation layer e.g. CMP (chemical mechanical polishing) or etch back process. The source, drain and gate electrodes 124, 126 and corresponding conductive vias 125, 127 are formed on the planarized second passivation layer 118 e.g. as shown in FIG. 1.

If the optional field plate 122 is omitted, the gate formation process can be simplified by forming the gate opening 130 extending through the second and surface passivation layers 118, 116 and into the compound semiconductor body 100, depositing the electrically conductive material 138 on the second passivation layer 118 so that the gate opening 130 is at least partly filled with the electrically conductive material 138 and removing the excess electrically conductive material 138 from the top side of the second passivation layer 118. As such, the mask step shown in FIG. 2C can be skipped. As explained above, the gate opening 130 can terminate before reaching the first (top) surface 102 of the compound semiconductor body 100 if desired so that part of the surface passivation layer 116 remains under the gate and forms a gate dielectric.

Figure 3:
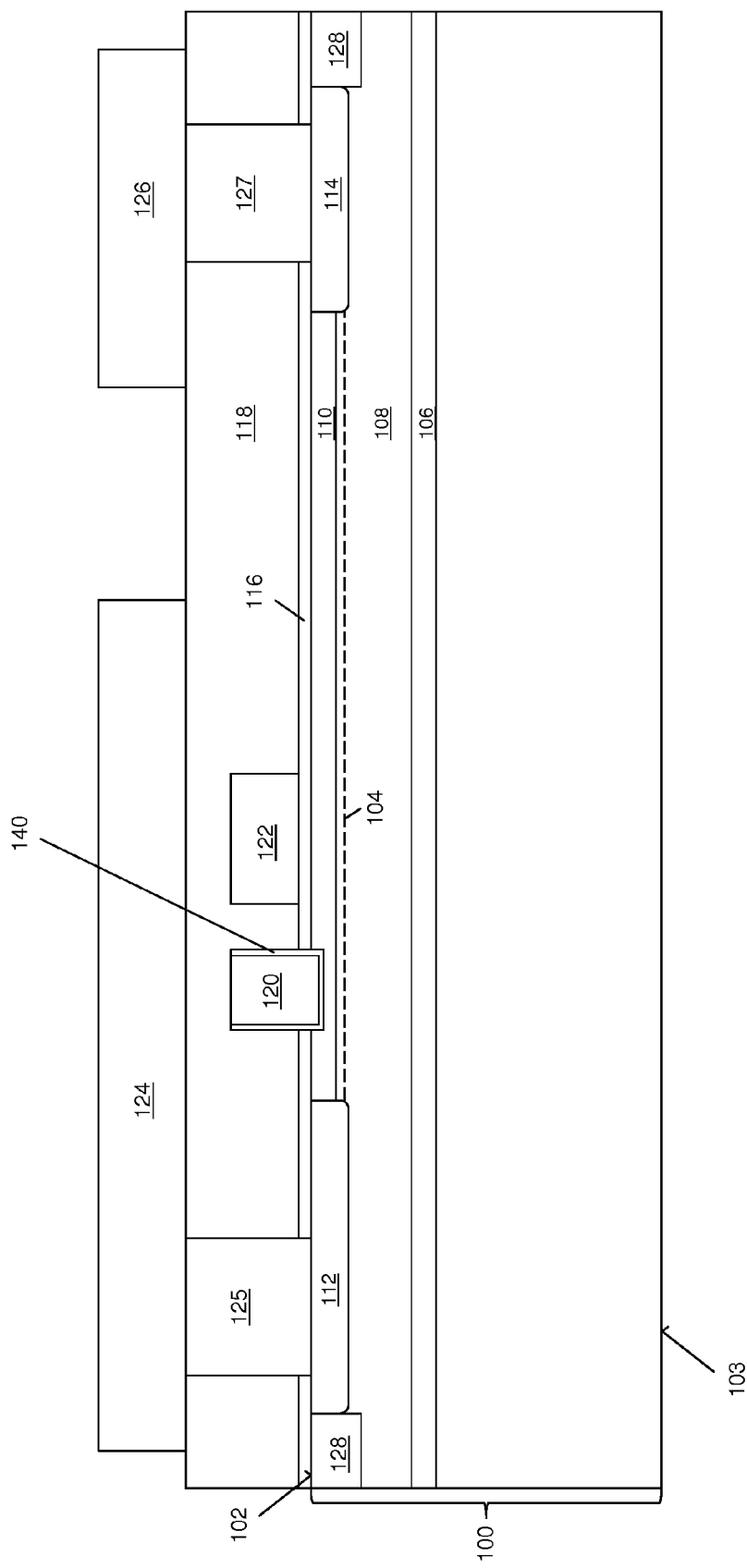
FIG. 3 illustrates a cross-sectional view of a compound semiconductor transistor according to another embodiment.

FIG. 3 illustrates a cross-sectional view of an embodiment of an HFET which is similar to the embodiment shown in FIG. 1, however the gate 120 is insulated from the compound semiconductor body 100 by a dielectric material 140 such as silicon dioxide. The dielectric material 140 can be formed via any conventionally suitable process after the gate opening 130 is formed and prior to deposition of the gate conductive material 138.

Figure 4:
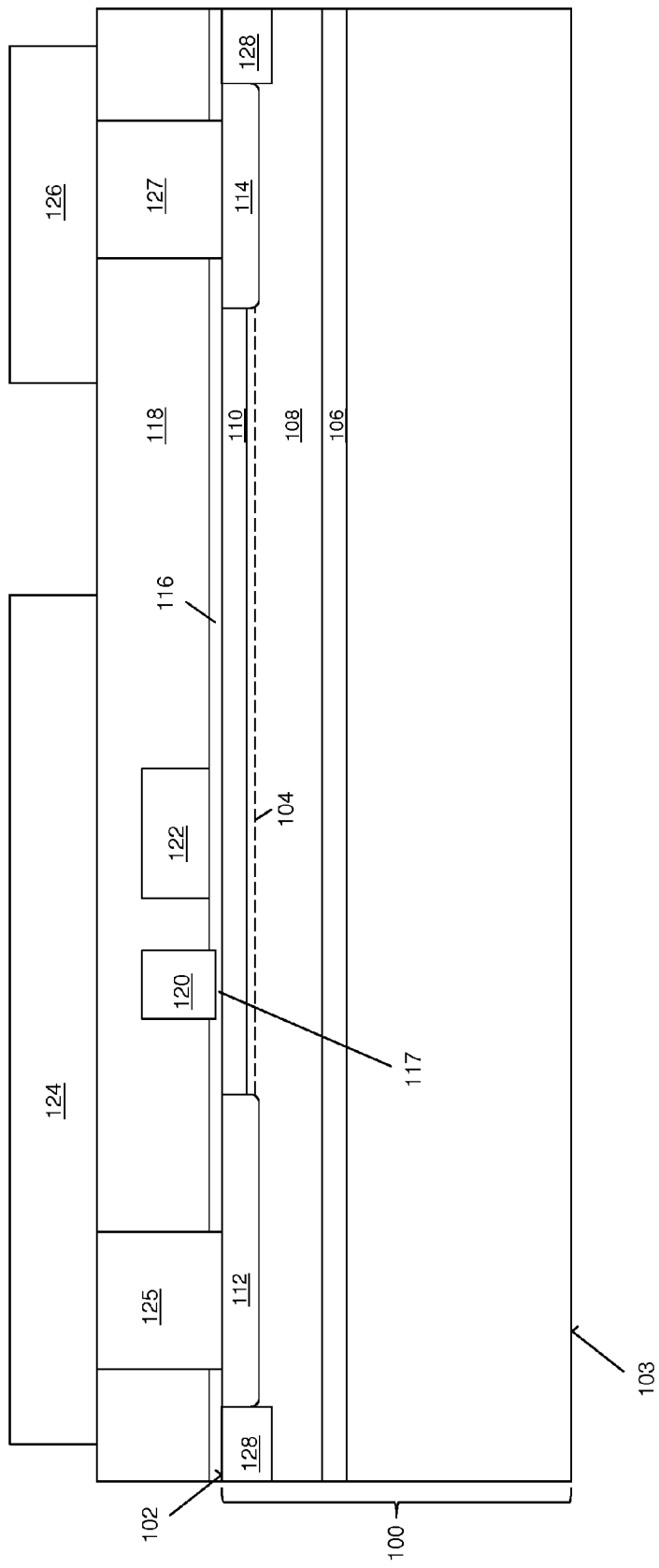
FIG. 4 illustrates a cross-sectional view of a compound semiconductor transistor according to yet another embodiment.

FIG. 4 illustrates a cross-sectional view of another embodiment of an HFET which is similar to the embodiment shown in FIG. 1, however the gate 120 terminates before reaching the first (top) surface 102 of the compound semiconductor body 100. This way, part 117 of the surface passivation layer 116 remains under the gate 120. This thinner part 117 of the surface passivation layer 116 interposed between the gate 120 and the compound semiconductor body 100 functions as a gate dielectric according to this embodiment.

Figure 5:
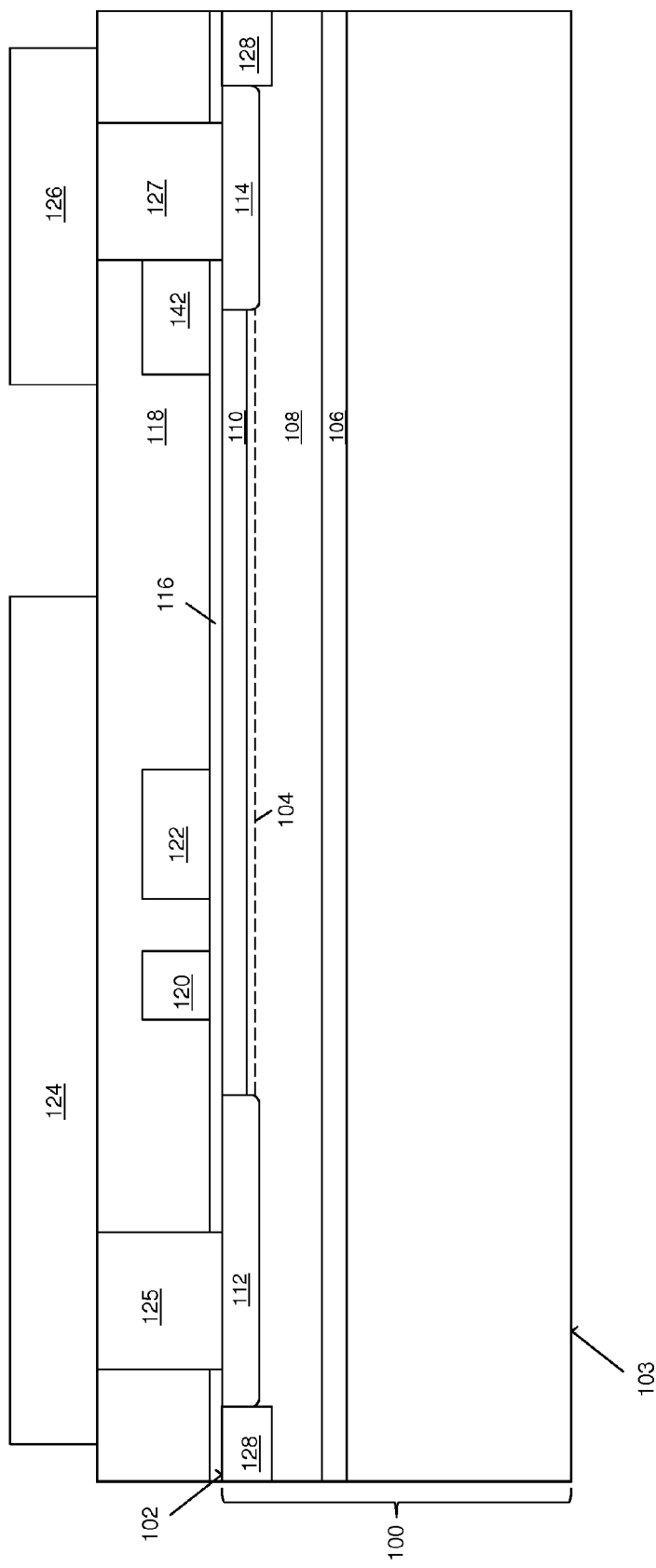
FIG. 5 illustrates a cross-sectional view of a compound semiconductor transistor according to still another embodiment.

FIG. 5 illustrates a cross-sectional view of still embodiment of an HFET which is similar to the embodiment shown in FIG. 1, however the gate 120 and the optional field plate 122 are both formed on the surface passivation layer 116. That is, the gate 120 does not extend into the surface passivation layer 116. This structure can be realized e.g. by skipping the processing associated with FIG. 2C (i.e. the masking of the field plate opening and further extending of the gate opening into the surface passivation layer). Also according to the embodiment illustrated in FIG. 5, a second optional field plate 142 is provided. The second optional field plate 142 is spaced apart from the gate 120 and the first optional field plate 122 (if provided) in the second passivation layer 118 and disposed on the surface passivation layer 116 over the drain 114. The second optional field plate 142 is electrically connected to the drain 114 and extends laterally further toward the source 112 than the drain 114. The second optional field plate 142 can be formed similarly to the first optional field plate 122 e.g. by forming an additional opening in the second passivation layer 118 (selective to the surface passivation layer) in the drain region of the structure and protecting the additional opening with the mask layer 134 if the gate opening 130 is to be extended into or through the surface passivation layer 116 e.g. as shown in FIG. 2C. The common conductive material deposition step shown in FIG. 2D at least partly fills both field plate openings and the gate opening with an electrically conductive material 138, which can then be planarized as shown in FIG. 2E.

Figure 6A:
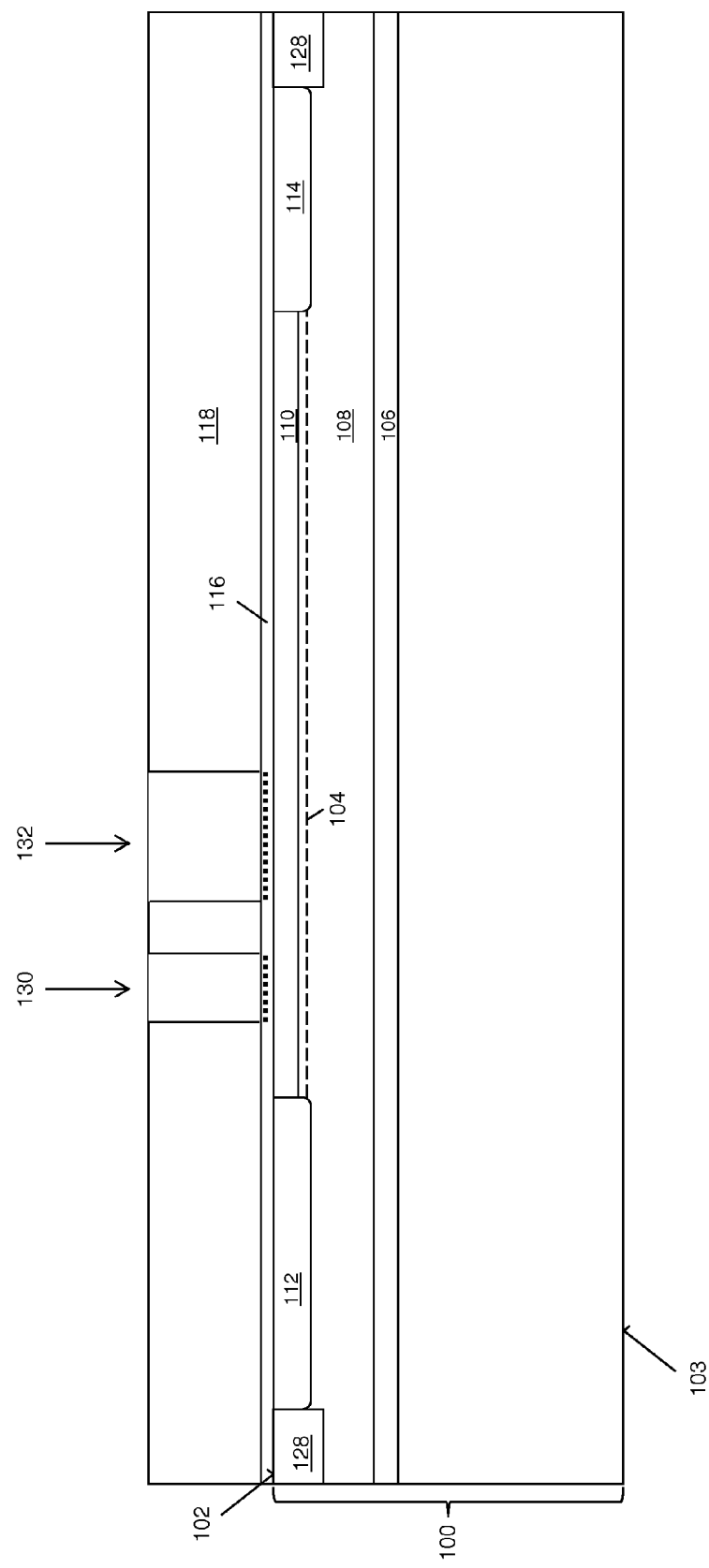
FIGS. 6A through 6F illustrate cross-sectional views of a compound semiconductor transistor during different stages of manufacturing according to another embodiment.

FIGS. 6A to 6F illustrate cross-sectional views of a compound semiconductor transistor during different steps of manufacturing the transistor according to another embodiment. FIG. 6A shows the compound semiconductor body 100 after the gate and any optional field plate openings 130, 132 are formed extending through the second passivation layer 118 to the surface passivation layer 116, and after the exposed part(s) of the surface passivation layer 116 are damaged e.g. by implanting non-reactive ions such as Ar, Kr or Xe into the exposed part(s) of the surface passivation layer 116. The damage implant into the surface passivation layer 116 results in a slanted profile after etching each exposed part of the surface passivation layer 116 with an isotropic component e.g. as is done for high voltage terminations with damage implant into a field oxide and subsequent wet etching of the oxide. The implanted damage is represented by dotted lines in FIGS. 6A through 6F.

Figure 6B:
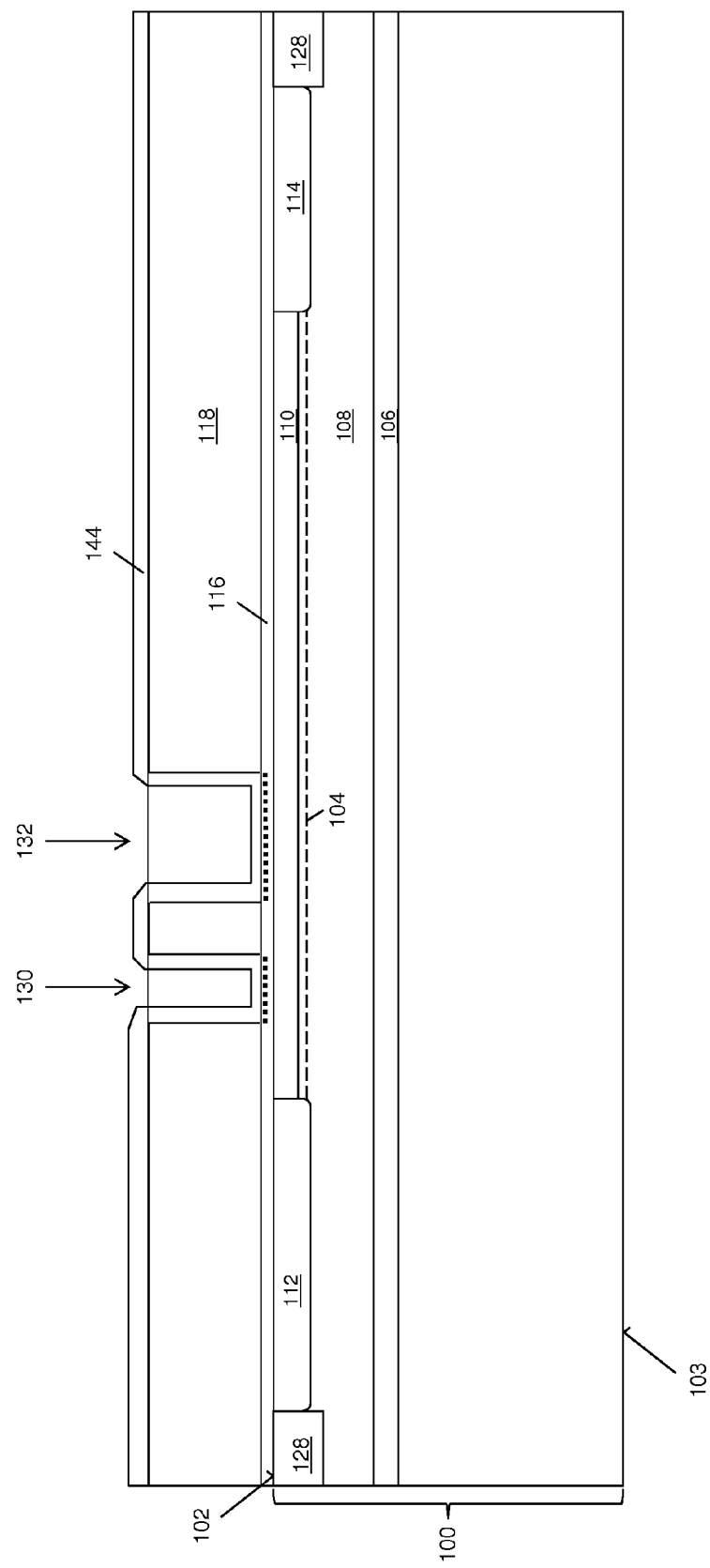
Figure 6C:
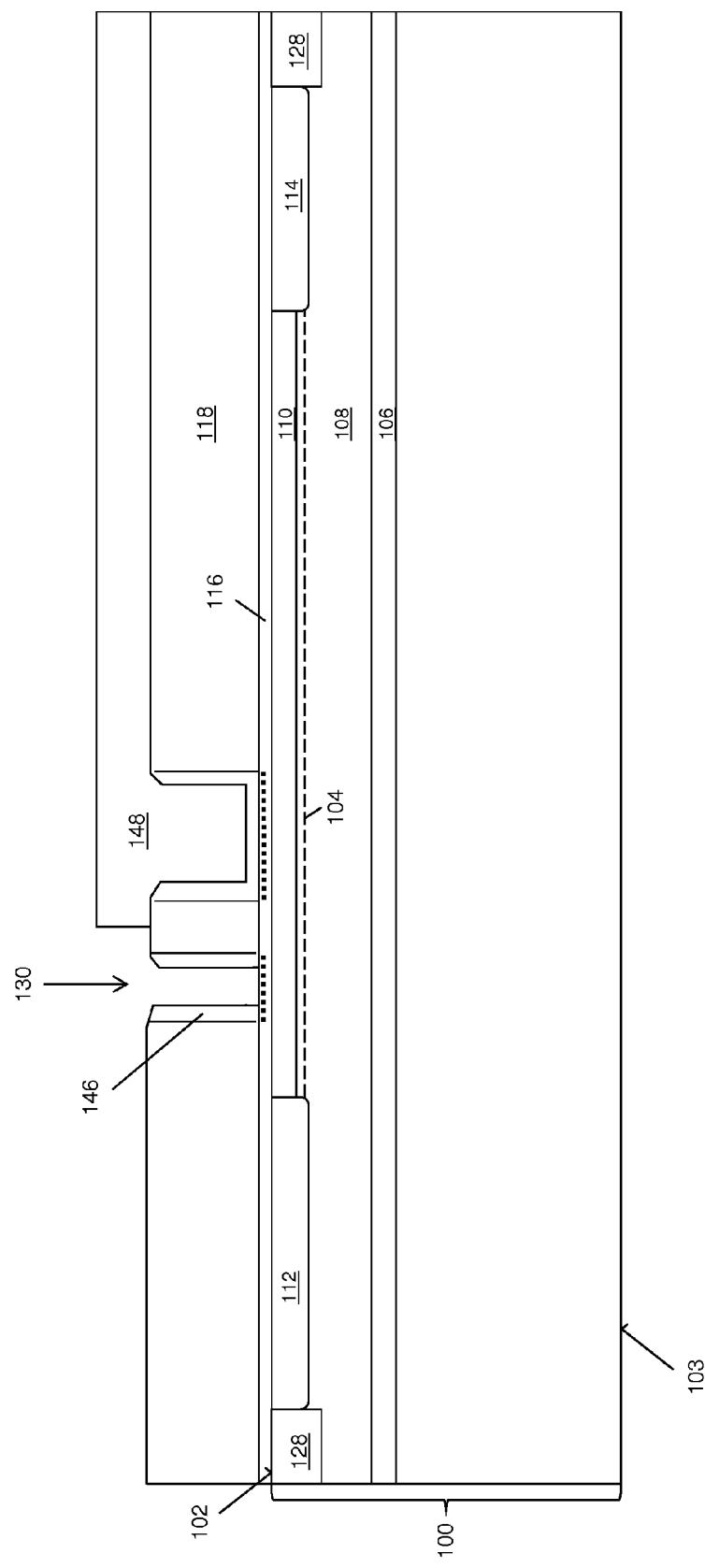
Figure 6D:
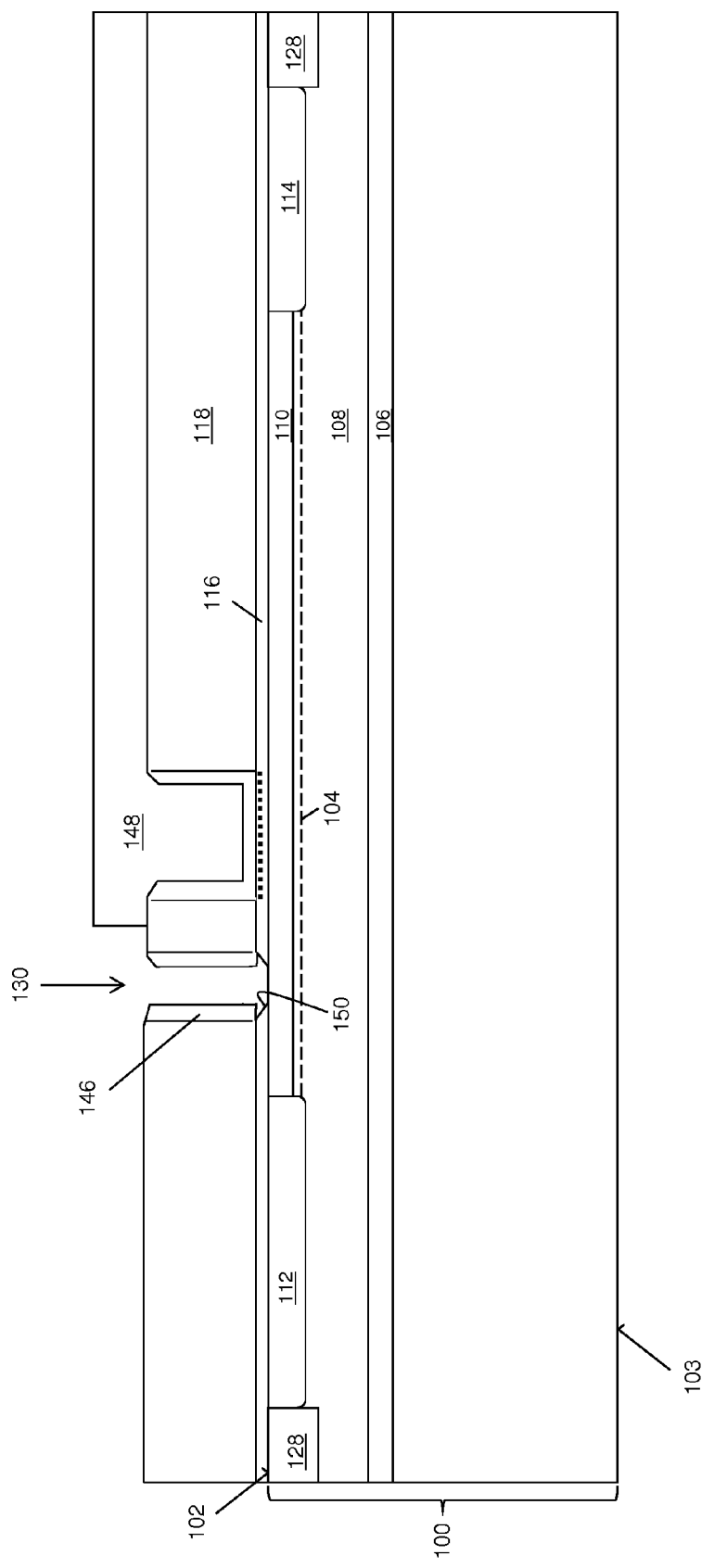

A conformal hard mask material 144 such as carbon is then deposited on the sidewalls and bottom of each opening 130, 132 as shown in FIG. 6B. The conformal hard mask material 144 has a thickness correlated to the surface passivation layer 116 e.g. 50 to 80 nm. The conformal hard mask material 144 is then anisotropically etched back to form the hard mask (spacers) 146 on the sidewalls of the gate opening 130, and a hard mask layer 148 is formed on the region of the second passivation layer 118 including the field plate openings 132 (if present) as shown in FIG. 6C. Next, the gate opening 130 is extended into the surface passivation layer 116 by isotropically etching the surface passivation layer 116 as shown in FIG. 6D. The lower part of the gate opening 130 formed in the surface passivation layer 116 will later contain the base of the gate 120, and has tapered sidewalls 150 due to the isotropic etching performed. The part of the gate opening 130 formed in the surface passivation layer 116 with the tapered sidewalls 150 is aligned with the part of the gate opening 130 in the second passivation layer 118. If desired, the gate opening 130 can be further extended into the compound semiconductor body 100 as previously described herein.

Figure 6E:
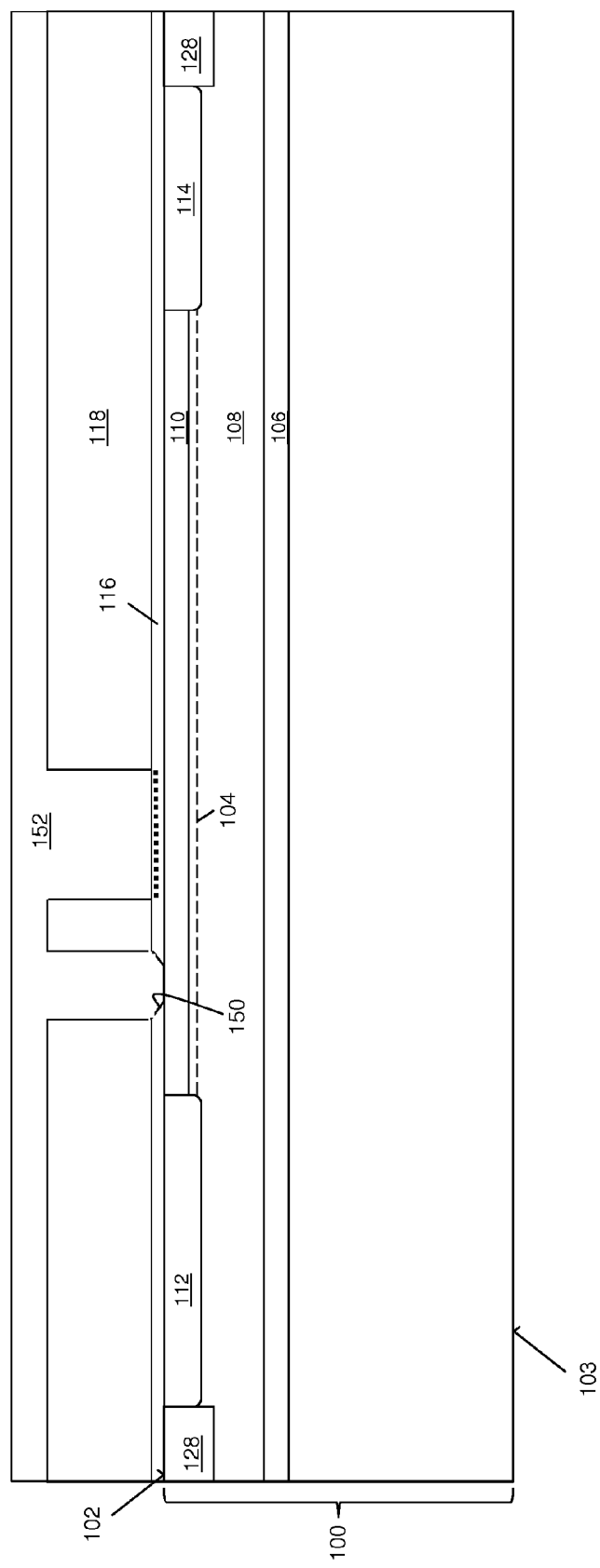
Figure 6F:
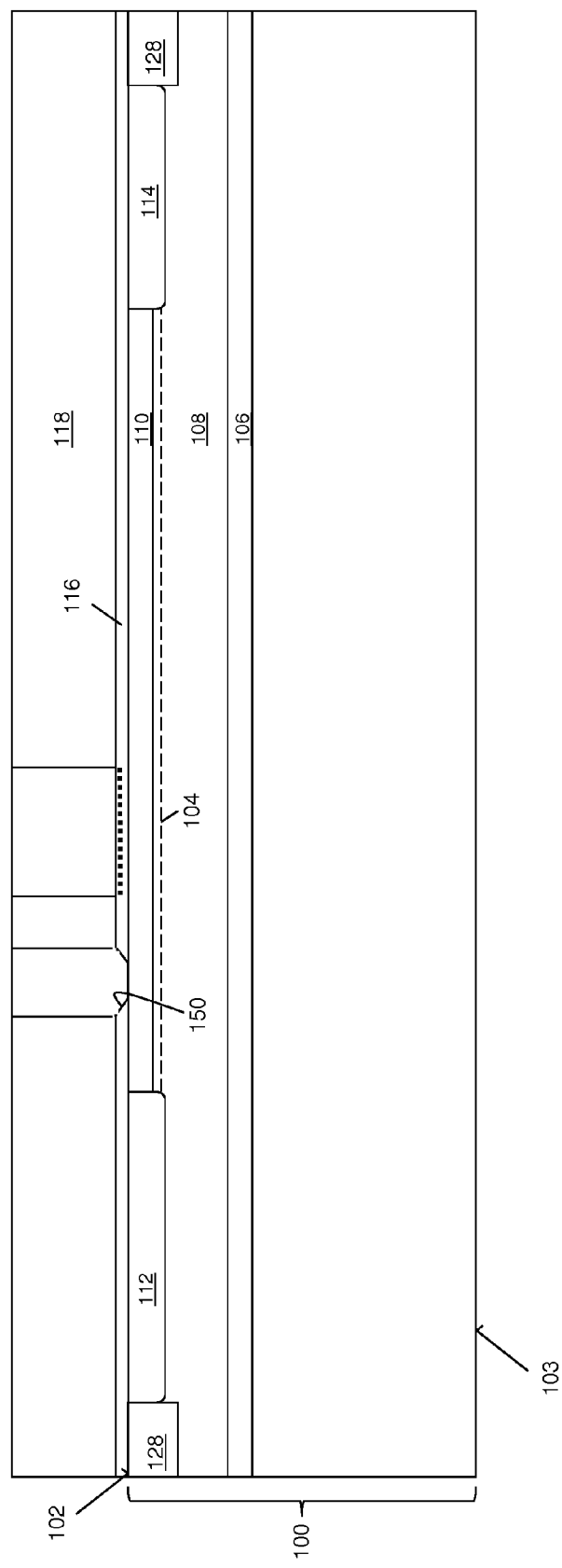

In each case, the hard mask 148 is then removed e.g. via an oxygen plasma process and an electrically conductive material 152 is deposited on the second passivation layer 118 after removal of the hard mask 148 so that the each opening 130, 132 is at least partly filled with the electrically conductive material 152 as shown in FIG. 6E. The excess electrically conductive material 152 is then removed from the side of the second passivation layer 118 facing away from the compound semiconductor body 100 via any suitable planarization process as shown in FIG. 6F.

Figure 7A:
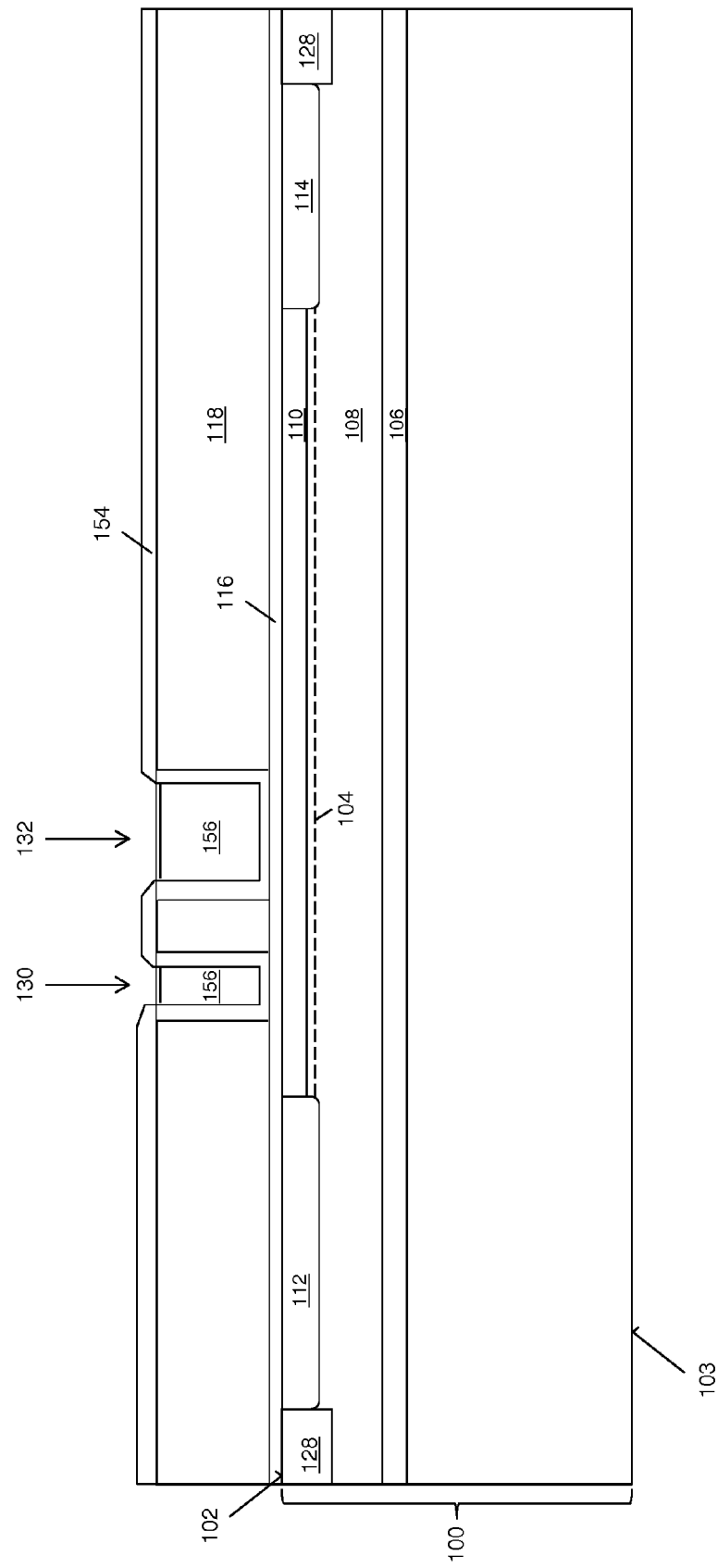
FIGS. 7A and 7B illustrate cross-sectional views of a compound semiconductor transistor during different stages of manufacturing according to yet another embodiment.
Figure 7B:
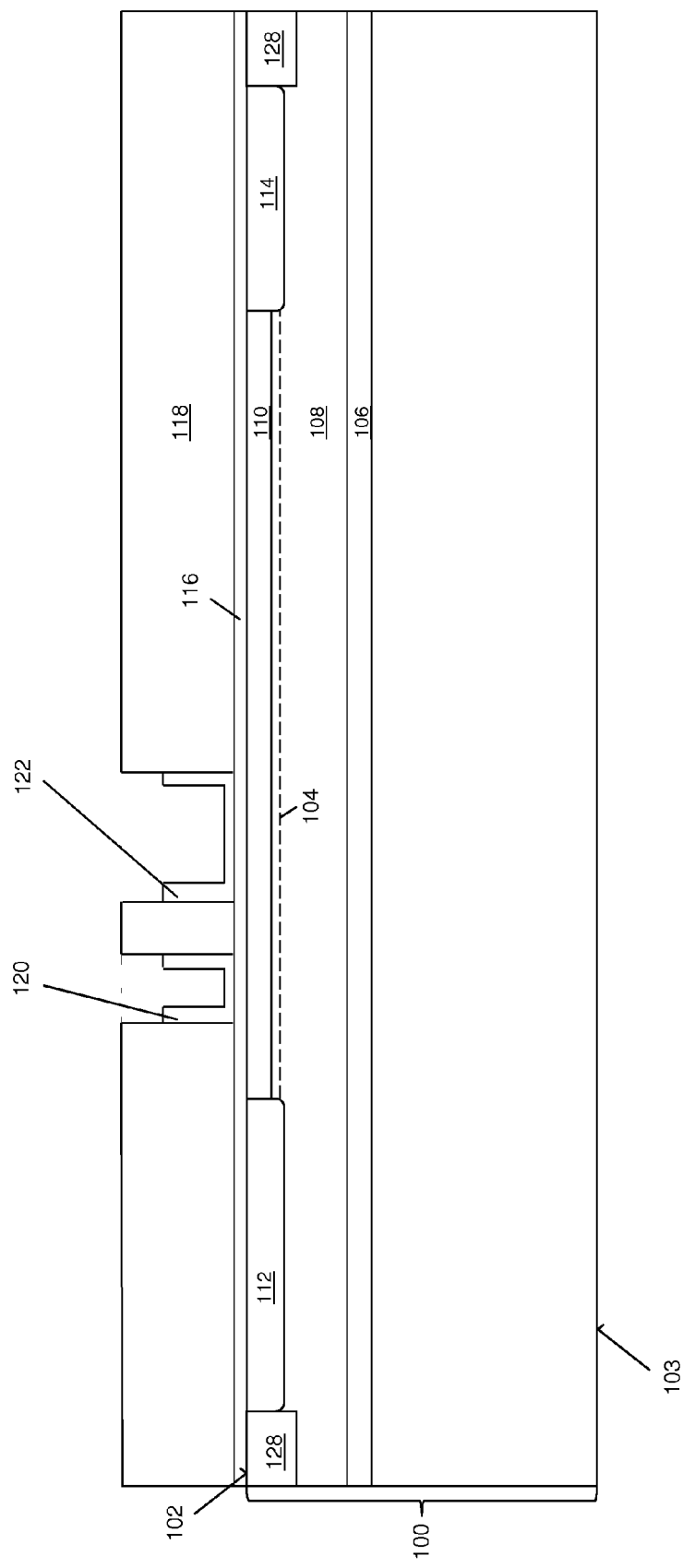

FIGS. 7A to 7B illustrate cross-sectional views of another embodiment of a method of manufacturing a compound semiconductor transistor. FIG. 7A shows the compound semiconductor body 100 after the source 112 and the drain 114 are formed in contact with the two-dimensional charge carrier gas 104, the surface passivation layer 116 is formed in contact with the first (top) surface 102 of the compound semiconductor body 100 and the second passivation layer 118 is formed on the first passivation layer 116. FIG. 7A also shows the compound semiconductor body 100 after the gate and one or more optional field plate openings 130, 132 are formed extending through the second passivation layer 118 and at least into the surface passivation layer 116, a conformal electrically conductive material 154 is deposited on the second passivation layer 118 so that the sidewalls and bottom of each opening 130, 132 are lined with the electrically conductive material 154 and an inner part of each opening 130, 132 adjacent the sidewalls and the bottom is filled with an electrically insulating material 156. In one embodiment, a conformal conductive material is sputtered onto the structure which leaves the inner part of the gate and field plate openings 130, 132 devoid of the conductive material.

Next, the electrically conductive material 154 is removed from a side of the second passivation layer 118 facing away from the compound semiconductor body 100 and from an upper part of the opening sidewalls to separate the gate 120 and field plate 122. Without lithography, this can be done using a CMP or blanket etch-back process. With a blanket etch-back process, the conductive bottom of the openings 130, 132 is protected e.g. by a resist plug 156 as shown in FIG. 7A. The electrically insulating material 156 is removed from the inner part of each opening 130, 132 after the gate 120 and field plate 122 are separated as shown in FIG. 7B. According to the embodiment shown in FIGS. 7A and 7B, the gate 120 and each optional field plate 122 lines the sidewalls and bottom of the corresponding opening 130, 132 formed through the second passivation layer 118 and into the surface passivation layer 116 so that the inner part of each opening 130, 132 adjacent the sidewalls and the bottom is not filled with an electrically conductive material.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing a transistor device, comprising:
   providing a compound semiconductor body having first surface and a two-dimensional charge carrier gas disposed below the first surface in the compound semiconductor body;
   forming a source in contact with the two-dimensional charge carrier gas;
   forming a drain spaced apart from the source and in contact with the two-dimensional charge carrier gas;
   forming a first passivation layer having a first surface in contact with the first surface of the compound semiconductor body and a second surface facing away from the first surface;
   forming a second passivation layer in contact with the first passivation layer, the second passivation layer having a different etch selectivity than the first passivation layer;
   forming an etched opening in the second passivation layer, the etched opening extending through the second passivation layer and stopping at the second surface;
   forming a further etched opening in the first passivation layer beneath the etched opening, the further etched opening extending from the second surface towards the compound semiconductor body;
   forming a gate in the etched opening and in the further etched opening; and
   forming a field plate spaced apart from the gate in the second passivation layer and disposed on the first passivation layer,
   wherein forming the etched opening and forming the further etched opening comprises two different etching processes, and
   wherein forming the gate and the field plate comprises:
      forming first and second laterally spaced apart openings extending through the second passivation layer to the first passivation layer, wherein the first opening corresponds to the etched opening;
      forming a mask layer on a region of the second passivation layer so that the second opening is protected by the mask layer and the first opening is unprotected;
      extending the first opening through the first passivation layer and into the compound semiconductor body while the second opening is protected by the mask layer thereby forming the further etched opening;

depositing an electrically conductive material on the second passivation layer after the first opening is extended through the first passivation layer and the mask layer is removed so that the first and second openings are at least partly filled with the electrically conductive material; and removing the electrically conductive material from a side of the second passivation layer facing away from the compound semiconductor material.

2. The method of claim 1, wherein forming the gate comprises:

forming an opening extending through the second passivation layer to the first passivation layer;

depositing a hard mask on sidewalk of the opening;

isotropically etching an opening with tapered sidewalls into the first passivation layer that is aligned with the opening in the second passivation layer;

removing the hard mask from the sidewalk of the opening in the second passivation layer;

depositing an electrically conductive material on the second passivation layer after the hard mask is removed so that the opening in the second passivation layer and the opening in the first passivation layer are at least partly filled with the electrically conductive material; and removing the electrically conductive material from a side of the second passivation layer facing away from the compound semiconductor material.

3. The method of claim 2, wherein isotropically etching an opening with tapered sidewalls into the first passivation layer comprises:

implanting non-reactive ions into an exposed part of the first passivation layer; and etching the exposed part of the first passivation layer with an isotropic component after the ion implantation.

4. The method of claim 1, further comprising:

electrically connecting the field plate to the drain.

5. The method of claim 1, wherein forming the gate comprises:

forming an opening extending through the second passivation layer and at least into the first passivation layer;

depositing a conformal electrically conductive material on the second passivation layer so that sidewalls and a bottom of the opening are lined with the electrically conductive material;

filling an inner part of the opening adjacent the sidewalls and the bottom with an electrically insulating material;

removing the electrically conductive material from a side of the second passivation layer facing away from the compound semiconductor material and from an upper part of the opening sidewalls; and removing the electrically insulating material from the inner part of the opening after the electrically conductive material is removed from the upper part of the opening sidewalls.

6. A method of manufacturing a transistor device, comprising:

providing a compound semiconductor body having a first surface and a two-dimensional charge carrier gas disposed below the first surface in the compound semiconductor body;

forming a source in contact with the two-dimensional charge carrier gas;

forming a drain spaced apart from the source and in contact with the two-dimensional charge carrier gas;

forming a first passivation layer having a first surface in contact with the first surface of the compound semiconductor body and a second surface facing away from the first surface;

forming a second passivation layer in contact with the first passivation layer, the second passivation layer having a different etch rate selectivity than the first passivation layer;

forming an etched opening in the second passivation layer, the etched opening extending through the second passivation layer and stopping at the second surface;

forming a further etched opening in the first passivation layer beneath the etched opening, the further etched opening extending from the second surface towards the compound semiconductor body;

forming a gate in the etched opening and in the further etched opening; and forming a field plate spaced apart from the gate in the second passivation layer and disposed on the first passivation layer, wherein forming the etched opening and forming the further etched opening comprises two different etching processes, and wherein forming the gate and the field plate comprises:

forming first and second laterally spaced apart openings extending through the second passivation layer to the first passivation layer, wherein the first corresponds to the etched opening;

forming a mask layer on a region of the second passivation layer so that the second opening is protected by the mask layer and the first opening is unprotected;

extending the first opening into the first passivation layer while the second opening is protected by h mask layer so that part of the first passivation layer remains under the first opening thereby forming the further etched opening;

depositing an electrically conductive material on the second passivation layer after the first opening is extended into the first passivation layer and the mask layer is removed so that the first and second openings are at least partly filled with the electrically conductive material; and removing the electrically conductive material from a side of the second passivation layer facing away from the compound semiconductor material.

\* \* \* \* \*

UNITED STATES PATENT AND TRADEMARK OFFICE
CERTIFICATE OF CORRECTION

PATENT NO.        : 9,443,941 B2  
APPLICATION NO.   : 13/487698  
DATED             : September 13, 2016  
INVENTOR(S)       : O. Haberlen et al.

Page 1 of 1

It is certified that error appears in the above-identified patent and that said Letters Patent is hereby corrected as shown below:

In the Claims
Column 8, line 25 (claim 1, line 3) please change "having first" to -- having a first --
Column 8, line 39 (claim 1, line 17) please change "etch selectivity" to -- etch rate selectivity --
Column 9, line 14 (claim 2, line 5) please change "on sidewalk" to -- on sidewalls --
Column 9, line 18 (claim 2, line 9) please change "the sidewalk" to -- the sidewalls --
Column 10, line 3 (claim 6, line 39) please change "first corresponds" to -- first opening corresponds --
Column 10, lines 44, 45 (claim 6, lines 44, 45) please change "by h mask" to -- by the mask --

Signed and Sealed this
Twenty-second Day of November, 2016

Michelle K. Lee
*Director of the United States Patent and Trademark Office*